US009086468B2

(12) United States Patent
Duerk et al.

(10) Patent No.: US 9,086,468 B2
(45) Date of Patent: Jul. 21, 2015

(54) MULTI-SLICE BLIPPED TRUEFISP-CAIPIRINHA

(76) Inventors: Jeffrey Duerk, Avon Lake, OH (US); Mark Griswold, Shaker Heights, OH (US); Karan Dara, Lakewood, OH (US)

( * ) Notice: Subject to any disclaimer, the term of this patent is extended or adjusted under 35 U.S.C. 154(b) by 597 days.

(21) Appl. No.: 13/445,001

(22) Filed: Apr. 12, 2012

(65) Prior Publication Data
US 2013/0271128 A1 Oct. 17, 2013

(51) Int. Cl.
G01R 33/561 (2006.01)
G01R 33/483 (2006.01)

(52) U.S. Cl.
CPC ........ G01R 33/5611 (2013.01); G01R 33/5614 (2013.01); G01R 33/4835 (2013.01)

(58) Field of Classification Search
USPC ........... 345/630; 324/300–322; 600/407–435; 382/128–131
See application file for complete search history.

(56) References Cited

U.S. PATENT DOCUMENTS

| 7,002,344 | B2 * | 2/2006 | Griswold et al. | 324/309 |
| 7,514,927 | B2 * | 4/2009 | Herzka et al. | 324/318 |
| 8,150,491 | B2 * | 4/2012 | Jung et al. | 600/410 |
| 8,405,395 | B2 * | 3/2013 | Setsompop et al. | 324/309 |
| 8,717,020 | B2 * | 5/2014 | Griswold et al. | 324/309 |
| 2004/0222794 | A1 * | 11/2004 | Griswold et al. | 324/309 |
| 2008/0169810 | A1 * | 7/2008 | Herzka et al. | 324/309 |
| 2008/0242972 | A1 * | 10/2008 | Jung et al. | 600/410 |
| 2011/0096092 | A1 * | 4/2011 | Griswold et al. | 345/630 |
| 2011/0254548 | A1 * | 10/2011 | Setsompop et al. | 324/309 |
| 2013/0099784 | A1 * | 4/2013 | Setsompop et al. | 324/309 |
| 2013/0181710 | A1 * | 7/2013 | Setsompop et al. | 324/309 |
| 2013/0271128 | A1 * | 10/2013 | Duerk et al. | 324/307 |
| 2014/0218026 | A1 * | 8/2014 | Moeller et al. | 324/309 |
| 2014/0225612 | A1 * | 8/2014 | Polimeni et al. | 324/309 |
| 2014/0247046 | A1 * | 9/2014 | Grinstead | 324/309 |
| 2014/0253120 | A1 * | 9/2014 | Ugurbil et al. | 324/309 |
| 2015/0115958 | A1 * | 4/2015 | Wang et al. | 324/309 |

FOREIGN PATENT DOCUMENTS

DE 102008039203 A1 * 2/2010

* cited by examiner

Primary Examiner — Melissa Koval
Assistant Examiner — Tiffany Fetzner

(57) ABSTRACT

Apparatus, methods, and other embodiments associated with multi-slice blipped TrueFISP-CAIPIRINHA in magnetic resonance imaging (MRI) are described. One example apparatus produces CAIPIRINHA phase cycling in a TrueFISP-CAIPIRINHA pulse sequence using a blipped gradient pattern rather than using radio frequency (RF) pulses. The phase cycling is produced by controlling a gradient coil in an MRI apparatus to produce a pre-scan pulse that is configured to set magnetization into a steady state position and then controlling the gradient coil to produce a balanced alternating phase pulse per repetition (TR). The balanced alternating phase pulse is configured to introduce a CAIPIRINHA aliasing pattern between slices. Controlling the gradient coil includes selectively adding and removing a finite gradient area from de-phase pulses and re-phase pulses in the pulse sequence.

15 Claims, 22 Drawing Sheets

MULTI-SLICE BLIPPED TRUEFISP-CAIPIRINHA

BACKGROUND

Conventional CAIPIRINHA is described in "Controlled aliasing in parallel imaging results in higher acceleration (CAIPIRINHA) for multi-slice imaging", *Magnetic Resonance in Medicine*, Volume 53, Issue 3, pages 684-691, March 2005, by Felix A. Breuer, Martin Blaimer, Robin M. Heidemann, Matthias F. Mueller, Mark A. Griswold, & Peter M. Jakob. Conventional CAIPIRINHA is also described in U.S. Pat. No. 7,002,344, issued Feb. 21, 2006, which describes, in Col. 9, lines 27-31, how "if a phase-modulated RF excitation is used i.e., if the pulse phases are modulated from one two-slice excitation to the next as (0°,0°=++) and (0°,180°=+−), a shifting of both slice data sets effectively ensues in the phase coding direction."

U.S. Pat. No. 7,002,344 FIG. 10c illustrates and Col. 12, lines 60-65 recite "a possible transfer to a segmented two-slice TrueFISP experiment. The first half of the acquisitions is alternatively provided with a pulse phase cycle (++,−−) while the other half is provided with a modulated pulse cycle (+−,−+). After the data acquisition, the acquired data are arranged according to their phase coding. Thus, a shifting of both slices against one another is achieved." Thus, conventional CAIPIRINHA has generally been described with respect to modulating a pulse phase cycle. However, additional experimentation has yielded improvements and specific embodiments not contemplated in the general description.

Magnetic resonance imaging (MRI) may employ parallel imaging techniques. Some parallel imaging techniques may produce under-sampling aliasing artifacts. These artifacts may be removed using a post-processing image reconstruction algorithm. These artifacts may also be mitigated using CAIPIRINHA. CAIPIRINHA modifies the appearance of aliasing artifacts to improve subsequent parallel image reconstruction. CAIPIRINHA has been shown to be more efficient than some other multi-slice parallel imaging concepts that rely solely on a post-processing approach.

In CAIPIRINHA, multiple slices of arbitrary thickness and distance are excited simultaneously using multi-band radiofrequency (RF) pulses. Data is then under-sampled, which produces superimposed slices that appear shifted with respect to each other. The shift between aliased slices can be controlled by modulating the phase of the individual slices in the multi-band excitation pulse from echo to echo.

TrueFISP (True Fast Imaging with Steady State Precession) is a coherent imaging technique that uses a balanced gradient waveform. Because it uses balanced gradient waveforms, TrueFISP may be referred to as a balanced steady state free precession technique. TrueFISP image contrast is determined by T2/T1 properties and depends primarily on TR (repetition time). As gradient hardware has continued to improve, shorter and shorter TRs are becoming available, which makes TrueFISP of continuing interest. TrueFISP relies on balanced gradient moments per TR and a short TR to reduce banding artifacts that may appear in an acquired image.

Even though TrueFISP is an inherently fast imaging sequence, there is always a need to image faster. For example, cardiac imaging and real-time imaging can be improved with faster imaging. Also, patients that cannot perform breath-holds appreciate faster imaging. One way to speed up image acquisition is to use parallel imaging where multiple slices are acquired simultaneously. However, conventional TrueFISP has TRs that are so short that it may be difficult, if even possible at all, to acquire interleaved slices.

In theory, a TrueFISP sequence might be accelerated by including two dimensional (2D) parallel imaging that acquires multiple slices simultaneously. However, incorporating 2D multi-slice parallel imaging and TrueFISP is also limited by the steady state requirements of TrueFISP. Additionally, reducing the number of phase encoding lines and acquiring slices with very small separations may lead to undesirable signal-to-noise ratio (SNR) loss.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
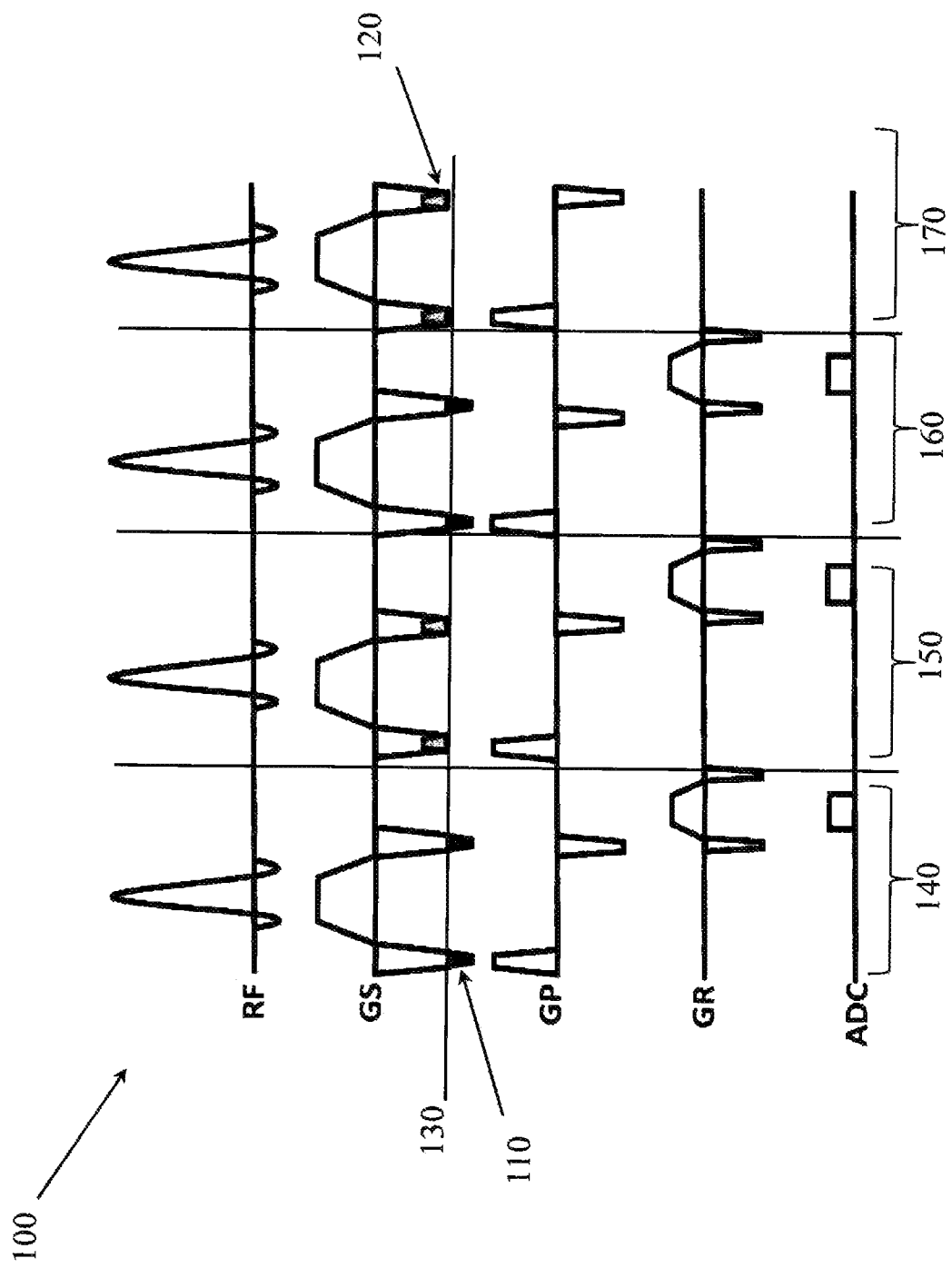
FIG. 1 illustrates a pulse sequence diagram for multi-slice blipped TrueFISP-CAIPIRINHA.
Figure 22:
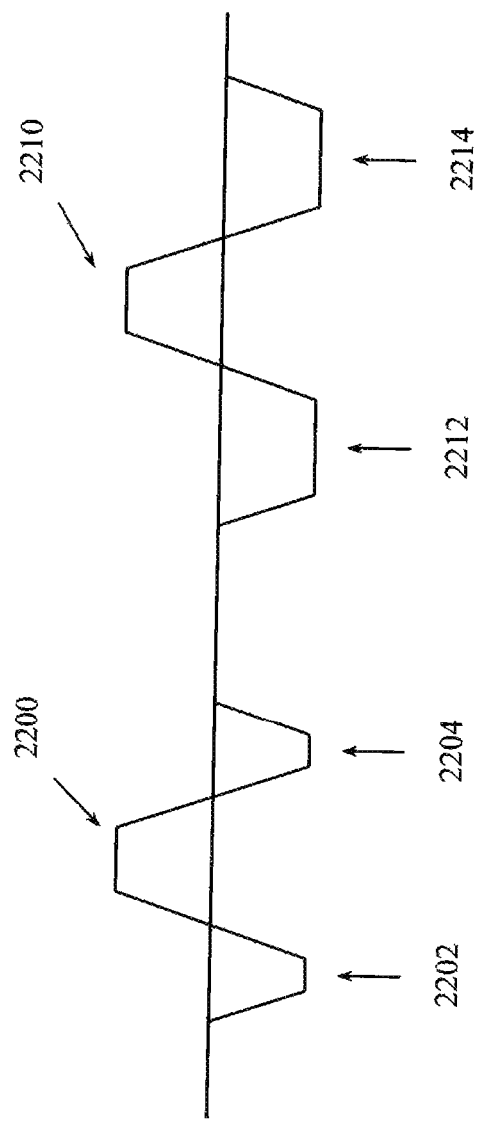
FIG. 22 illustrates a changed gradient area.

Example apparatus and methods control an MRI apparatus to produce a multi-slice blipped TrueFISP-CAIPIRINHA sequence that has a pre-scan pulse configured to set magnetization into a steady state position and that has an alternating phase in a TR to introduce the CAIPIRINHA aliasing pattern between slices acquired in parallel. In one example, the pre-scan pulse is an α/2 pulse. In one example the alternating phase pulse is a π pulse. More generally, example apparatus and methods add or remove a finite gradient area from the de-phasers and re-phasers of the slice select gradient. The finite gradient area may be referred to as a delta. Adding or removing the finite gradient area may be accomplished in different manners including those illustrated in FIGS. 1 and 22. Example apparatus and methods introduce the +/−CAIPIRINHA shift between slices using balanced gradients instead of using RF pulses. The phase cycling produced by the RF pulse in a conventional CAIPIRINHA is replaced with a blipped gradient pattern. A "blipped gradient pattern" is a pattern that changes the gradient area. FIG. 1 illustrates one approach to changing gradient area. However, other approaches, for example, changing the amount of time during which the pre-phasing or re-phasing portion of a gradient is active may also be employed. For example, FIG. 22 illustrates changing gradient area by alternating shortening and lengthening the time during which a gradient is active. In one example, the blipped gradient is applied by the slice select gradient.

In one embodiment, the delta may be configured based on parameters including, but not limited to, different gyromagnetic ratios for different resonant species, differences between slices, and phases by which a slice is to be shifted. In one embodiment, the delta may be manipulated by controlling the amplitude of the gradient, by controlling the amount of time the gradient is on, or by controlling a combination of both.

Example apparatus and methods add CAIPIRINHA phase cycling to TrueFISP using gradients instead of RF pulses. SNR loss may be mitigated by using the CAIPIRINHA approach. CAIPIRINHA modifies the aliasing pattern of slices by selectively applying phase cycling to cause one slice to shift away from another slice. Shifting slices relative to each other through phase cycling yields lesser aliased energy to reconstruct and improved coil sensitivity matrices, which in turn yields improved reconstructed SNR. Conventionally the phase cycling was achieved using RF pulses. Example apparatus and methods introduce the phase cycling by blipping a gradient (e.g., slice select gradient) instead of using RF pulses.

One conventional TrueFISP-CAIPIRINHA sequence introduces slice phase modulations via composite multi-slice TrueFISP RF pulses. Unfortunately this may change the off-resonance profile of TrueFISP and produce signal and contrast changes between slices. The signal and contrast changes can be disadvantageous when, for example, banding artifacts fail to line up in multi-slice acquisitions.

Therefore, example apparatus and methods replace the RF pulse based CAIPIRINHA phase cycling with a blipped gradient phase cycling. The multi-slice blipped CAIPIRINHA produces images with improved reconstructed SNR at various under-sampling factors when compared to SENSE images. Additionally, the multi-slice blipped CAIPIRINHA produces images without the undesired changes in image contrast. Recall that SENSE is an MRI technique that uses spatial information related to the coils of a receive array to reduce conventional Fourier encoding and thus to reduce scan times.

In one embodiment, a two-slice TrueFISP sequence includes an α/2 pre-scan pulse to set the magnetization into a steady state position. An alternating π phase is then added to the TR to introduce the CAIPIRINHA aliasing pattern between the two acquired slices. In one embodiment, the alternating π phase is added by either adding or removing a finite gradient area from the de-phasers and re-phasers of the slice select gradient. The finite gradient area may be referred to as a delta and may be described in units of mT/ms/m. While a two slice TrueFISP sequence is described, different numbers of slices may be employed. Similarly, while an α/2 pre-scan pulse is described, other pre-scan pulses may be employed and while an alternating π phase is described per TR, different alternating phases may be added to less than all TRs.

Figure one illustrates a pulse sequence diagram 100 having four TRs, (140, 150, 160, 170). Each TR is illustrated having the delta either added or removed. Different samples and acquisitions may be configured in different ways and thus, in one example, the delta may be calculated as a function of the gyromagnetic ratio of the hydrogen proton, as a function of the gyromagnetic ratio of another resonant species in a sample, as a function of the separation distance between the slices being imaged, as a function of the phase by which the slice is being shifted, or based on other parameters. In different embodiments, the delta can be introduced by modifying the amplitude of a gradient, by modifying the time a gradient is on, or combinations thereof. In one embodiment, the $0^{th}$ gradient moment is balanced per TR.

Pulse sequence diagram 100 is associated with TrueFISP-CAIPIRINHA. Areas 110 below line 130 depict where a delta area has been added and areas 120 above line 130 depict where a delta area has been deleted. The additions and deletions occur in the re-phaser and de-phaser portions of the slice gradient Gs. The additions extend the dephaser or rephaser below line 130 while the deletions cause the dephaser and the rephaser not to reach line 130. The additions and deletions are configured to maintain balance in the Gs gradient. In one embodiment, the additions and deletions are alternated per TR.

FIG. 22 illustrates changing gradient area by alternating between shortening and lengthening the time during which a gradient is active. A first gradient profile 2200 includes a dephaser 2202 and a rephaser 2204 that are active for a shorter period of time than a dephaser 2212 and a rephaser 2214 found in a profile 2210.

FIGS. 2 through 14 present experimental results acquired when example TrueFISP-CAIPIRINHA sequences were tested with standard receive coils and various matrix coils (e.g., 12-element head matrix coil, 24 element spine matrix coil). Contrast comparisons between a conventional multi-slice TrueFISP and a multi-slice blipped TrueFISP-CAIPIRINHA were performed for various TR (repetition time) and TE (echo time) values. Both phantom and human contrast comparisons were performed. In various experiments, two sets of images were acquired, one for TrueFISP-CAIPIRINHA and one for SENSE. In some experiments the slice phase modulation was absent and in other experiments the slice phase modulation was present. In one example, fully-sampled slices were acquired and used to generate coil sensitivity maps, which were in turn used to reconstruct images. The experimental results illustrated the improved performance of the multi-slice blipped TrueFISP-CAIPIRINHA sequence.

Figure 2:
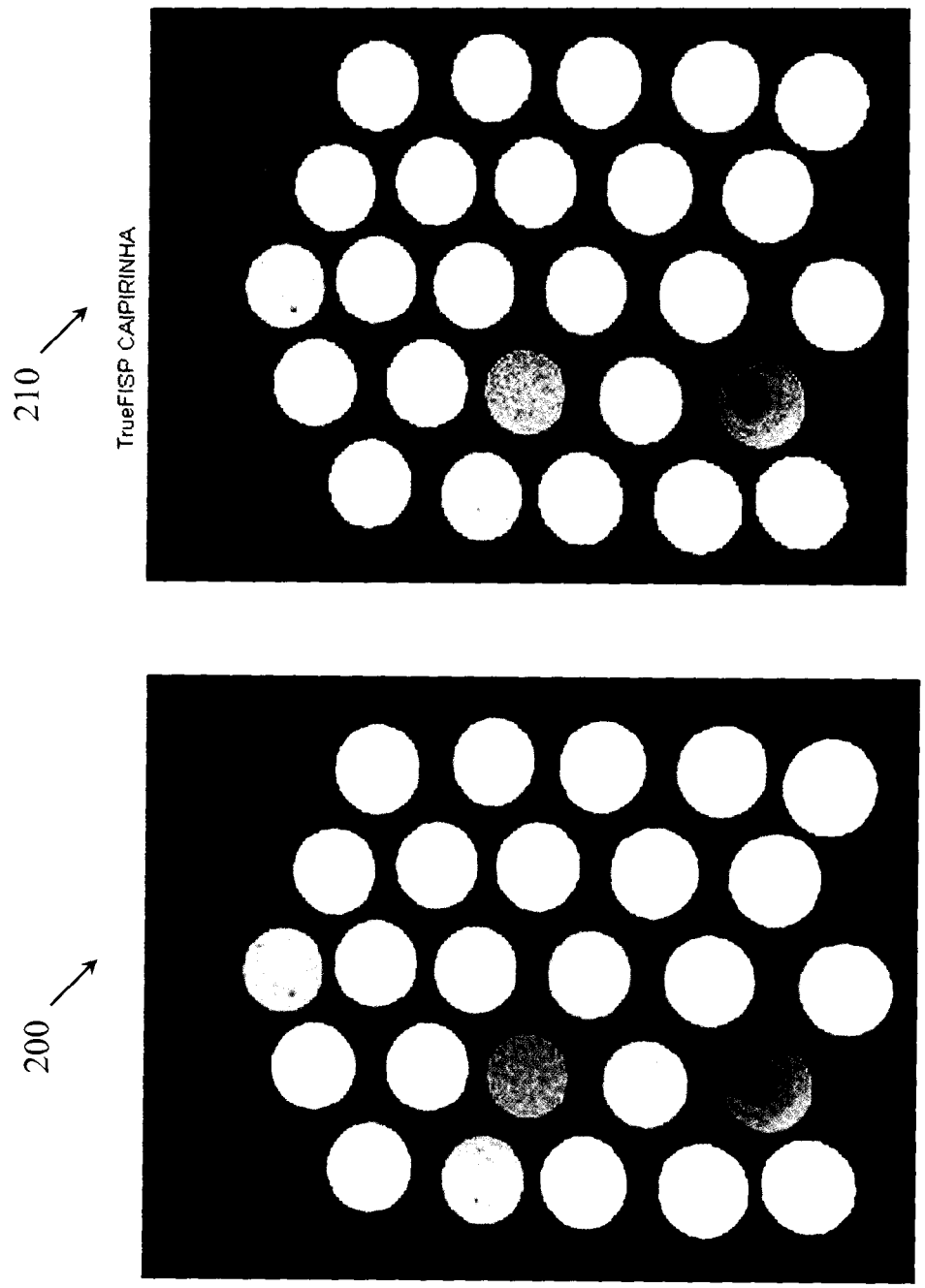
FIG. 2 illustrates slice images from a conventional TrueFISP sequence and from a multi-slice blipped TrueFISP-CAIPIRINHA sequence.

FIG. 2 illustrates a slice image 200 from a conventional TrueFISP sequence and a slice image 210 from a multi-slice blipped TrueFISP-CAIPIRINHA sequence. The slices show data acquired from a phantom. Vials in the phantom have unique T1 and T2 values calculated using a spin-echo sequence. In different experiments, T1 values ranged from 21-3000 ms and 12 values ranged from 12-2500 ms.

Figure 3:
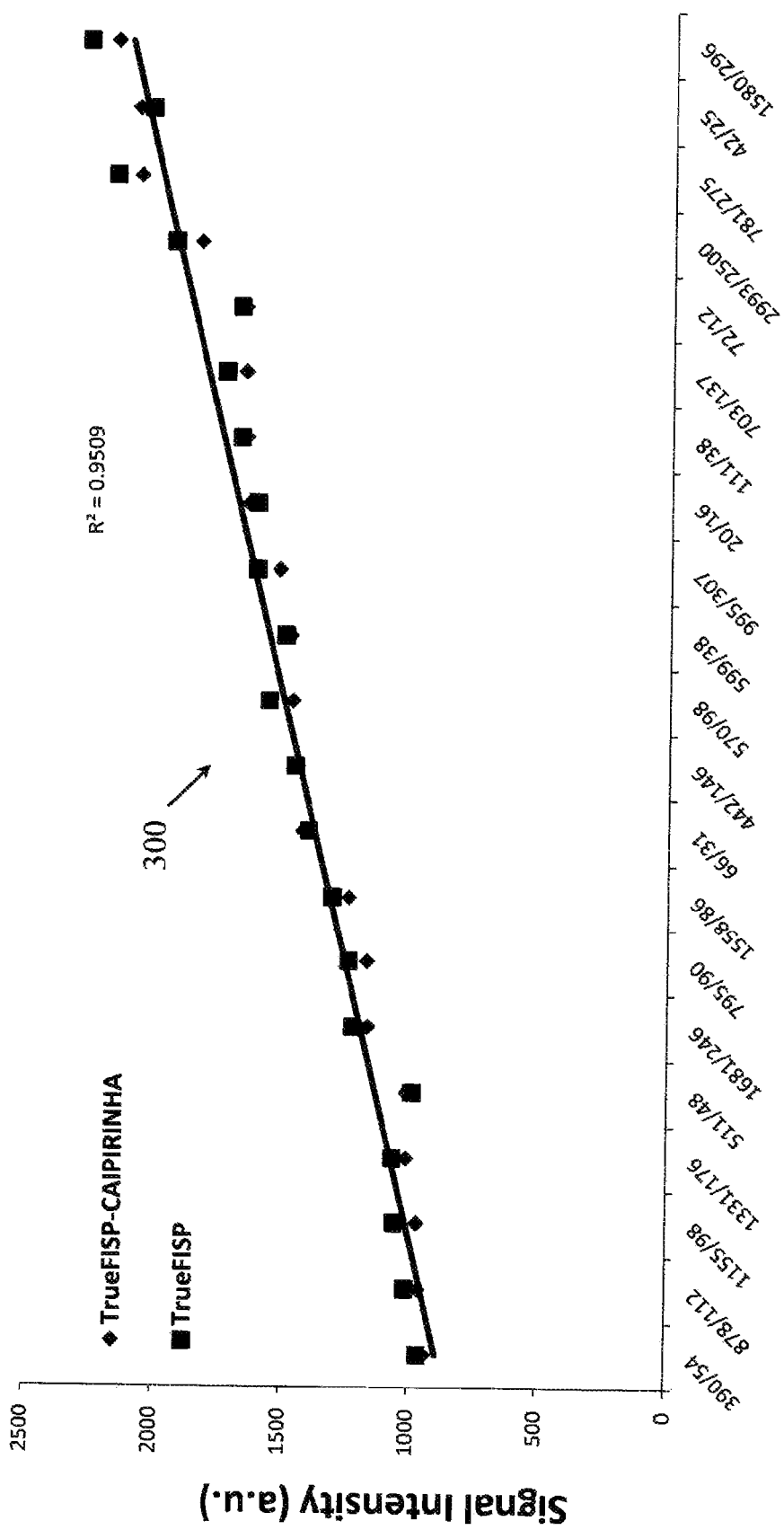
FIG. 3 illustrates a correlation plot between a conventional TrueFISP sequence and the multi-slice blipped TrueFISP-CAIPIRINHA sequence.

FIG. 3 illustrates a correlation plot 300. The correlation plot 300 compares a conventional TrueFISP sequence as represented by the squares and a multi-slice blipped TrueFISP-CAIPIRINHA sequence as represented by the diamonds. The $R^2$ value equaled 0.95.

Figure 4:
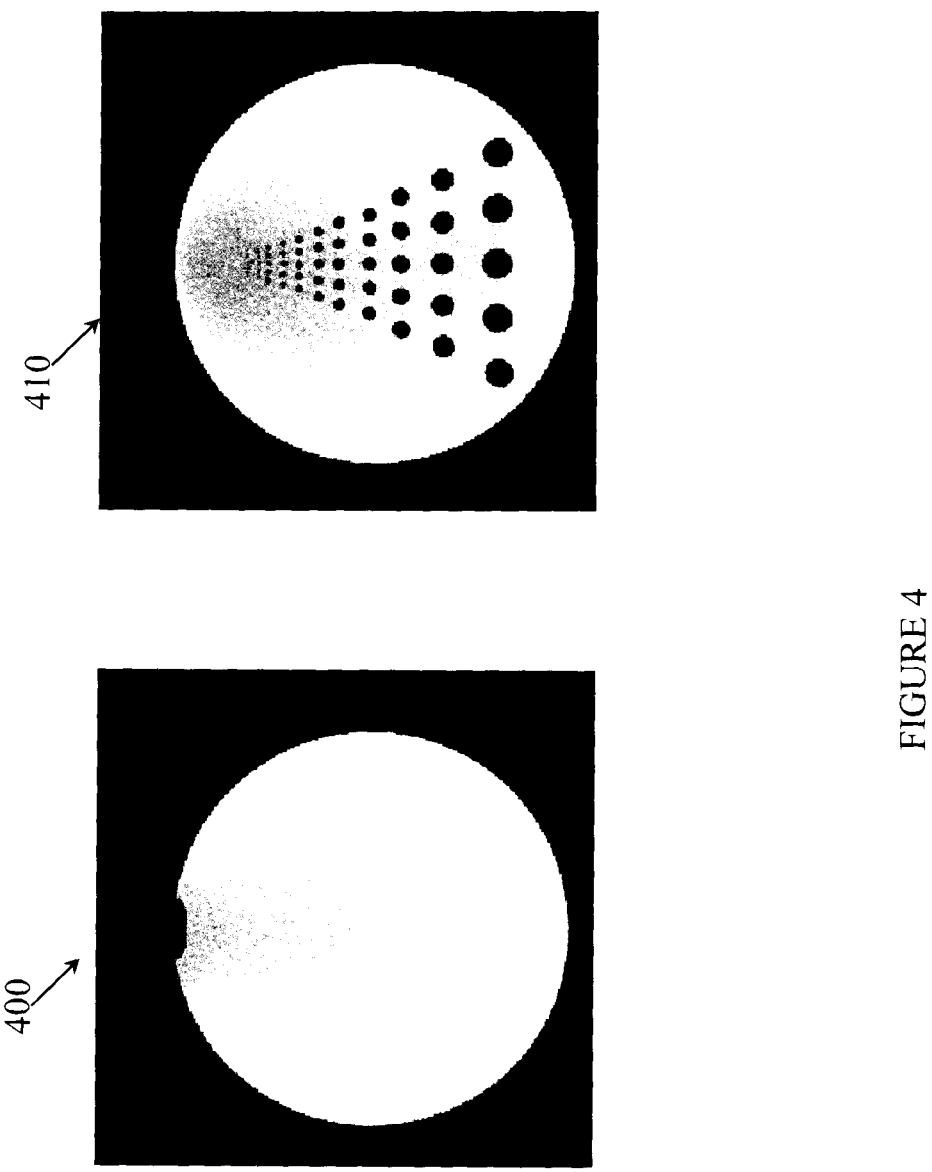
FIG. 4 illustrates phantom images for two slices where the slice phase was un-modulated between the slices.
Figure 5:
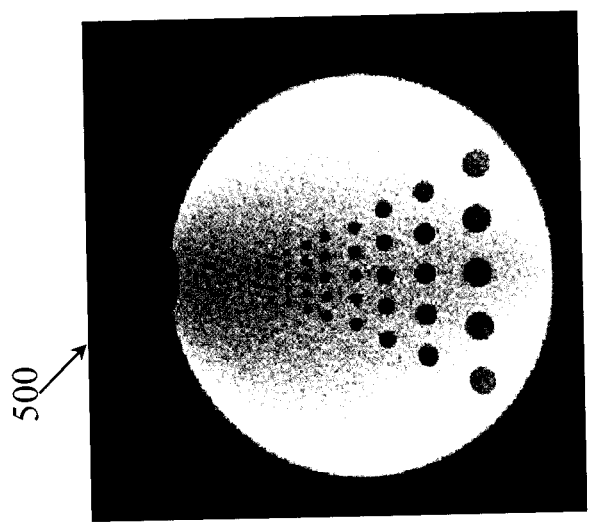
FIG. 5 illustrates the result of a multi-slice excitation composite RF pulse where the slice phase was unchanged for the slices.

FIG. 4 illustrates a first image 400 associated with a first slice and a second image 410 associated with a second slice. In FIG. 4, the slice phase was un-modulated between image 400 and image 410. FIG. 5 illustrates the result of a multi-slice excitation composite RF pulse where the slice phase was not shifted between the first slice and the second slice. Since the slice phase was not shifted, the two resultant slices appear to be super-imposed on each other and the phantom images 400 and 410 appear as a single image.

Figure 6:
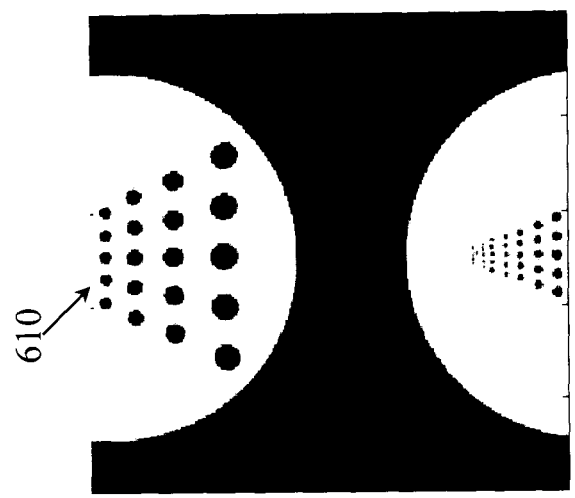
FIG. 6 illustrates individual slices that were acquired when a π phase was applied to the second slice.
Figure 6:
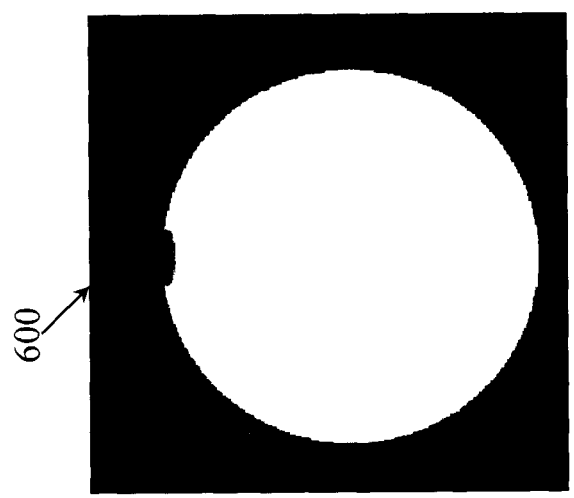
Figure 7:
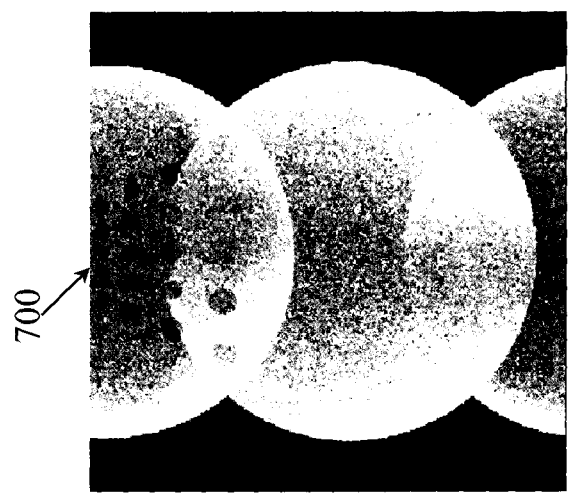
FIG. 7 illustrates the result of a multi-slice excitation composite RF pulse where the slice phase was changed.

FIG. 6 illustrates individual slices 600 and 610 that were acquired when a π phase shifting pulse was applied to the second slice. The π phase shifting pulse caused the second slice 610 to be moved by FOV/2, (FOV=field of view). While slice 600 remains in the center of the FOV, slice 610 appears to have been shifted to the edges of the FOV. Thus, the two slices do not both appear centered in the FOV and do not align. FIG. 7 illustrates the result of a multi-slice excitation composite RF pulse where the slice phase was changed. The shifted images in FIG. 7, which represent slices 600 and 610, do not appear to suffer from the super-imposition issue illustrated in FIG. 5.

Figure 8:
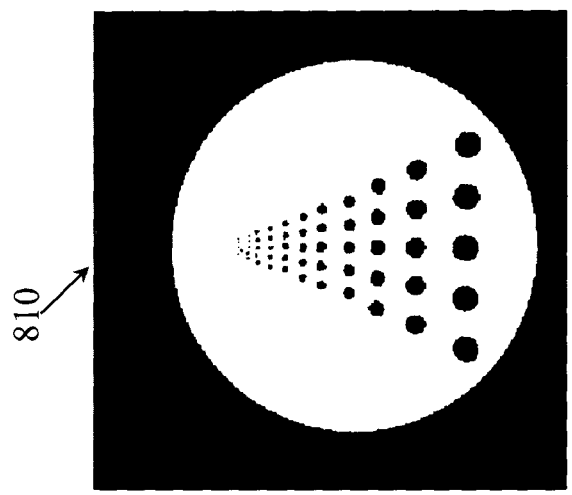
FIG. 8 illustrates images reconstructed from the data acquired in FIG. 7.
Figure 8:
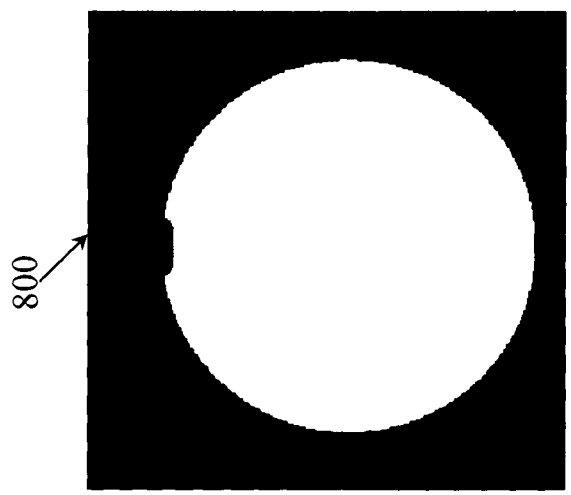

FIG. 8 illustrates images 800 and 810 that were reconstructed from the slices acquired in FIG. 7. Images 800 and 810 were reconstructed using a pixel-by-pixel SENSE approach.

Figure 9:
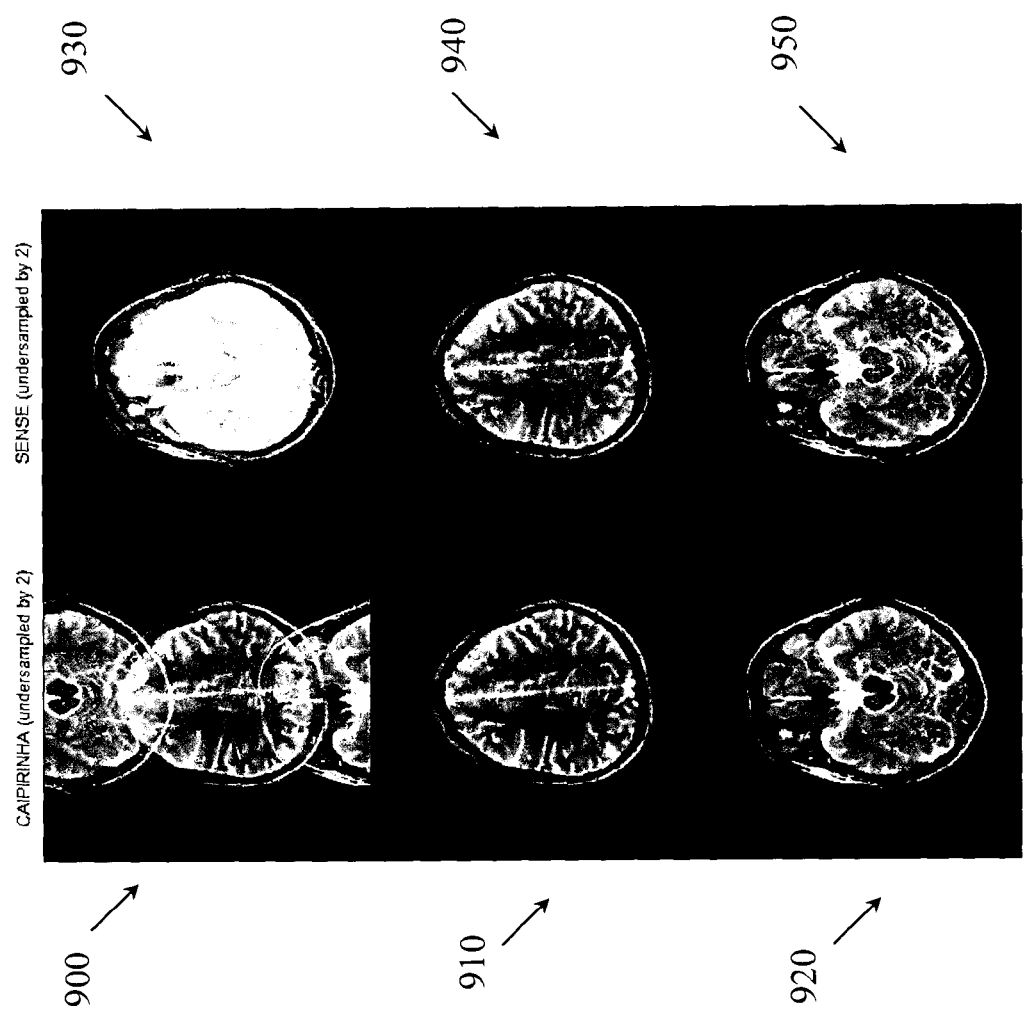
FIG. 9 illustrates brain slices that were acquired using TrueFISP-CAIPIRINHA and TrueFISP-SENSE respectively, reconstructed TrueFISP CAIPIRINHA images, and reconstructed TrueFISP-SENSE images.

FIG. 9 illustrates brain slices 900 and 930 that were acquired using TrueFISP-CAIPIRINHA and TrueFISP-SENSE respectively. Images 910 and 920 are TrueFISP-CAIPIRINHA images reconstructed from slice 900. Images 940 and 950 are TrueFISP-SENSE images reconstructed from slice 930.

Figure 10:
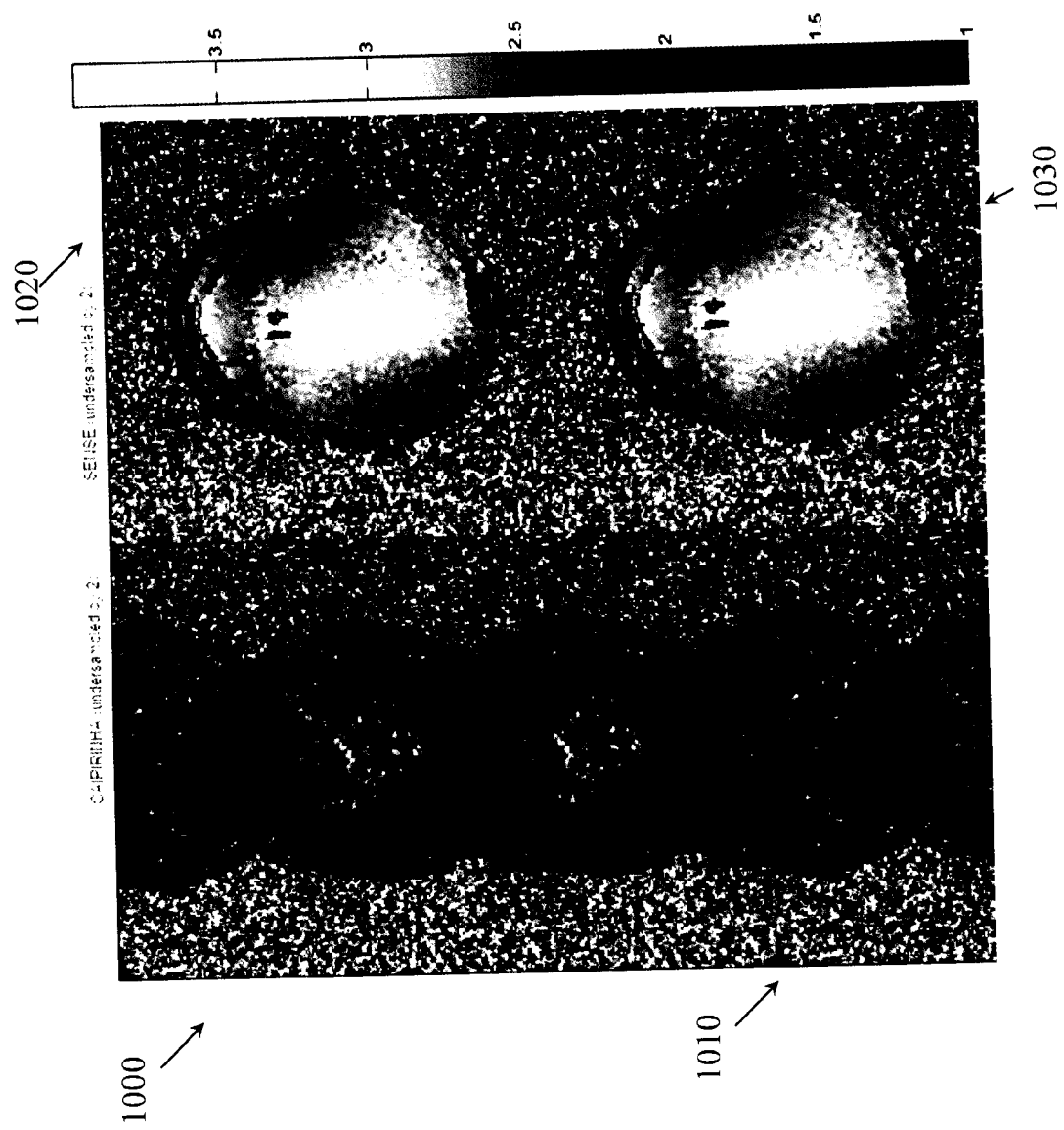
FIG. 10 illustrates g-factor maps for the reconstructed TrueFISP-CAIPIRINHA images in FIG. 9 and for the reconstructed TrueFISP-SENSE images in FIG. 9.

FIG. 10 illustrates g-factor maps 1000 and 1010 for the reconstructed TrueFISP-CAIPIRINHA images 910 and 920 in FIG. 9. FIG. 10 also illustrates g-factor maps 1020 and 1030 for the reconstructed TrueFISP-SENSE images 940 and 950 in FIG. 9. Comparing and contrasting the g-factor maps 1000, 1010, 1020, and 1030 illustrates SNR reduction for TrueFISP-CAIPIRINHA.

Figure 11:
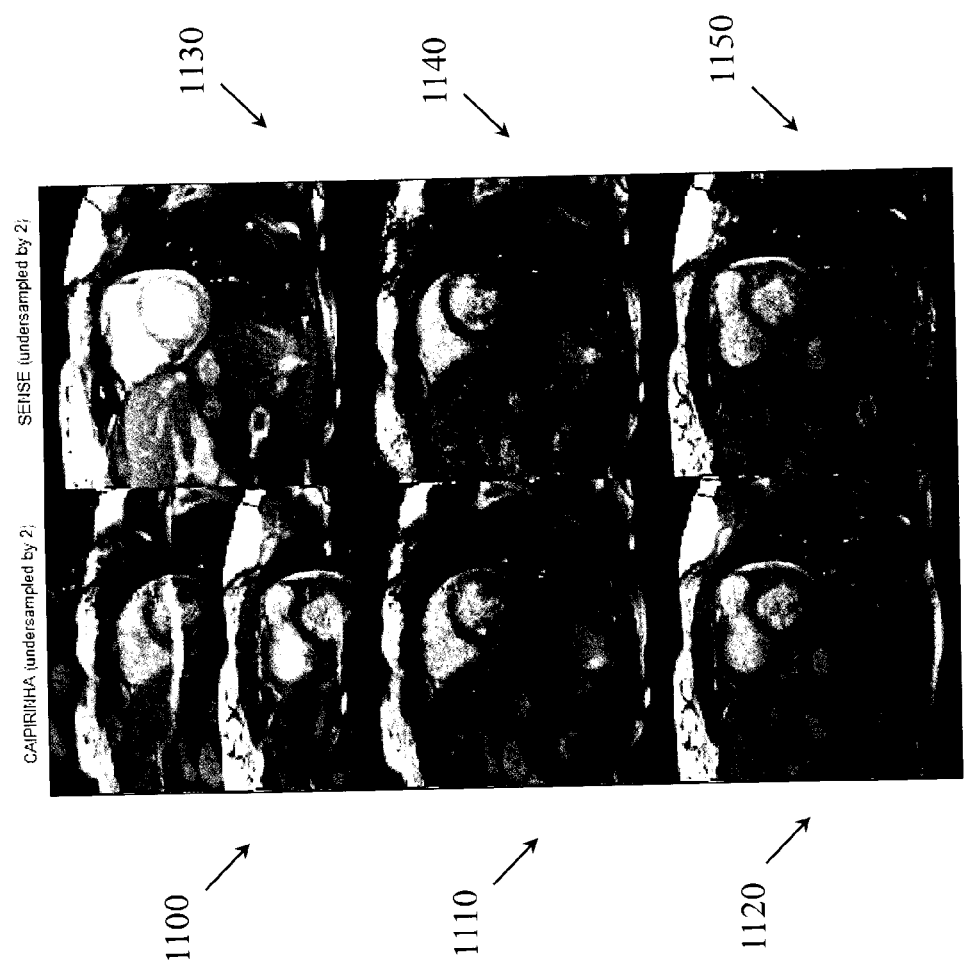
FIG. 11 illustrates under-sampled TrueFISP-CAIPIRINHA and TrueFISP-SENSE cardiac images, TrueFISP-CAIPIRINHA images reconstructed from the cardiac images, and TrueFISP-SENSE images reconstructed from the cardiac images.

FIG. 11 illustrates under-sampled TrueFISP-CAIPIRINHA cardiac slice 1100 and under-sampled TrueFISP-SENSE cardiac slice 1130. The degree of under-sampling is R=2. Images 1110 and 1120 are reconstructed TrueFISP-CAIPIRINHA images of slices 1100 and 1130 respectively. Images 1140 and 1150 are reconstructed TrueFISP-SENSE images of slices 1100 and 1130 respectively.

Figure 12:
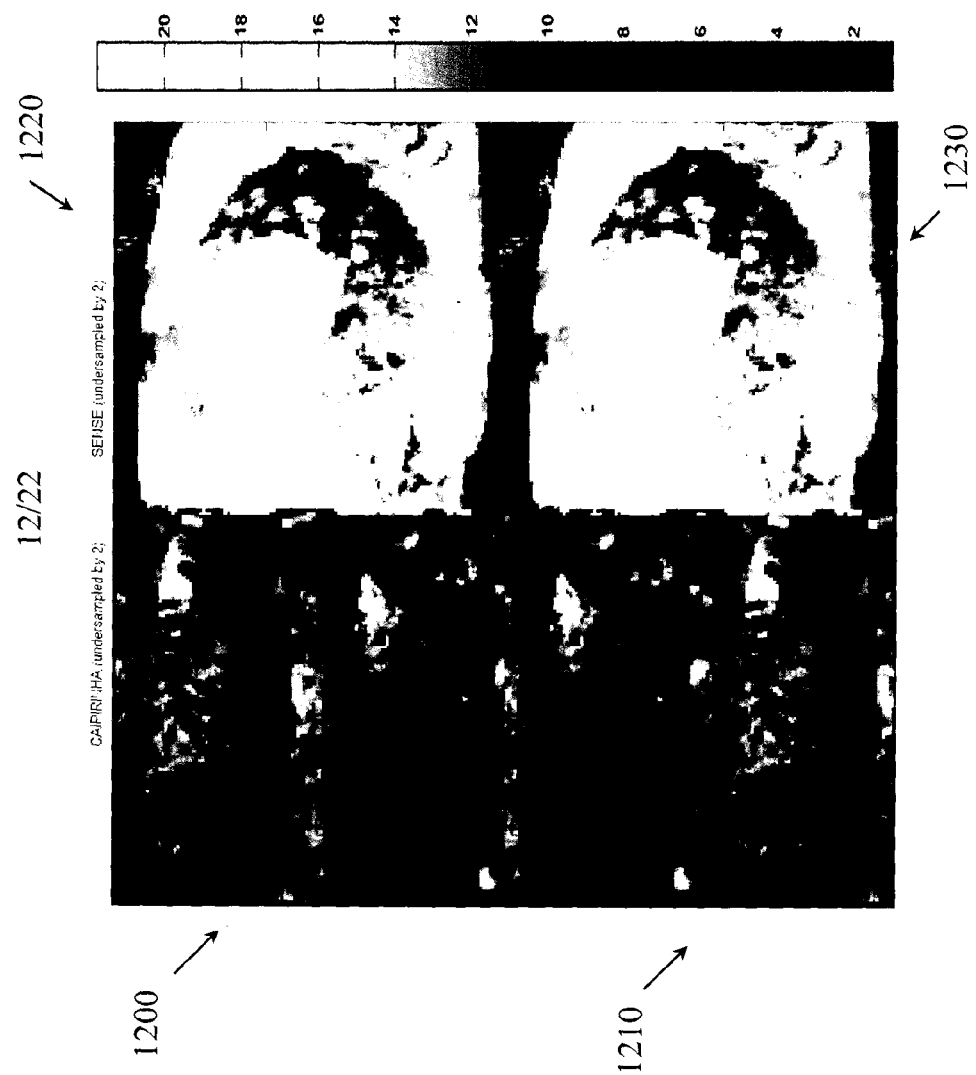
FIG. 12 illustrates g-factor maps for the reconstructed TrueFISP-CAIPIRINHA images of FIG. 11 and for the reconstructed TrueFISP-SENSE images of FIG. 11.

FIG. 12 illustrates g-factor maps 1200 and 1210 for the reconstructed TrueFISP-CAIPIRINHA images of 1110 and 1120 of FIG. 11. FIG. 12 also illustrates g-factor maps 1220 and 1230 for the reconstructed TrueFISP-SENSE images 1140 and 1150 of FIG. 11. O-factor mean and maximum values were obtained from defined regions of interest. Comparing and contrasting the g-factor maps illustrates improved performance by the TrueFISP-CAIPIRINHA approach.

Figure 13:
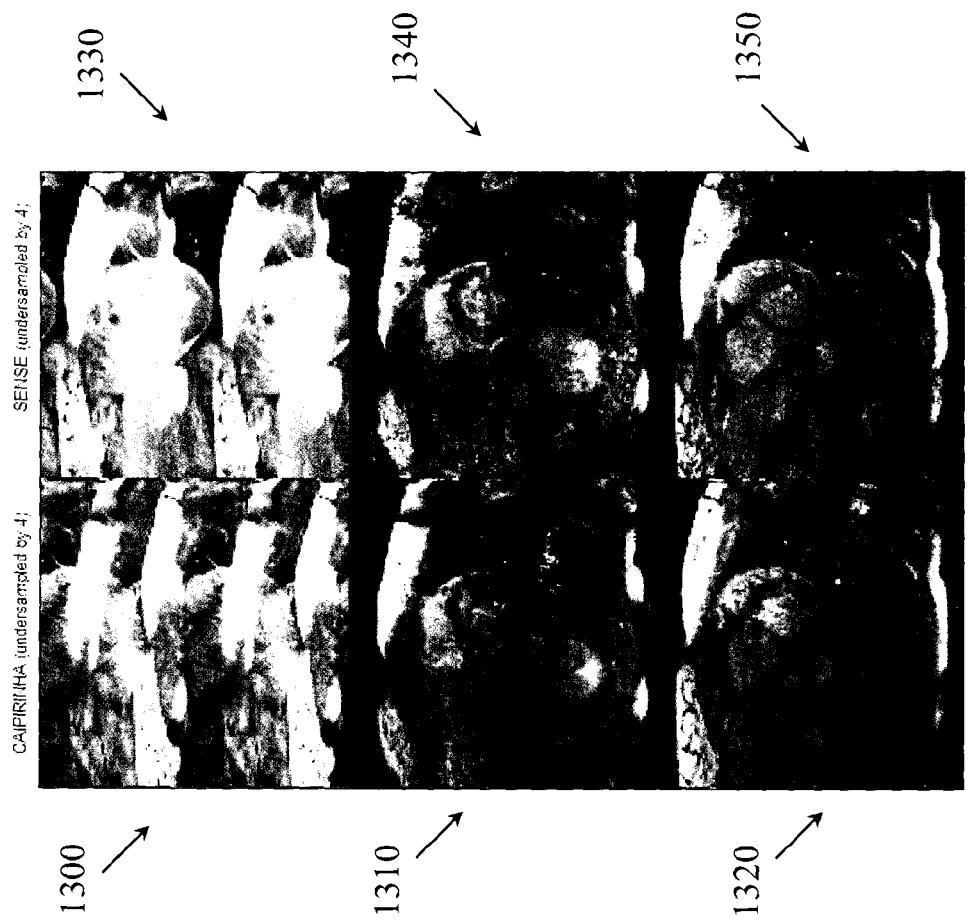
FIG. 13 illustrates under-sampled TrueFISP-CAIPIRINHA and TrueFISP-SENSE cardiac images, TrueFISP-CAIPIRINHA images reconstructed from the cardiac images, and TrueFISP-SENSE images reconstructed from the cardiac images.

FIG. 13 illustrates under-sampled TrueFISP-CAIPIRINHA cardiac slice 1300 and TrueFISP-SENSE cardiac slice 1330. The degree of under-sampling is R=4. Image 1310 is a TrueFISP-CAIPIRINHA image reconstructed from slice 1300 and image 1320 is a TrueFISP-CAIPIRINHA image reconstructed from slice 1300. FIG. 1340 is a TrueFISP-SENSE image reconstructed from slice 1330 and FIG. 1350 is a TrueFISP-SENSE image reconstructed from slice 1330.

Figure 14:
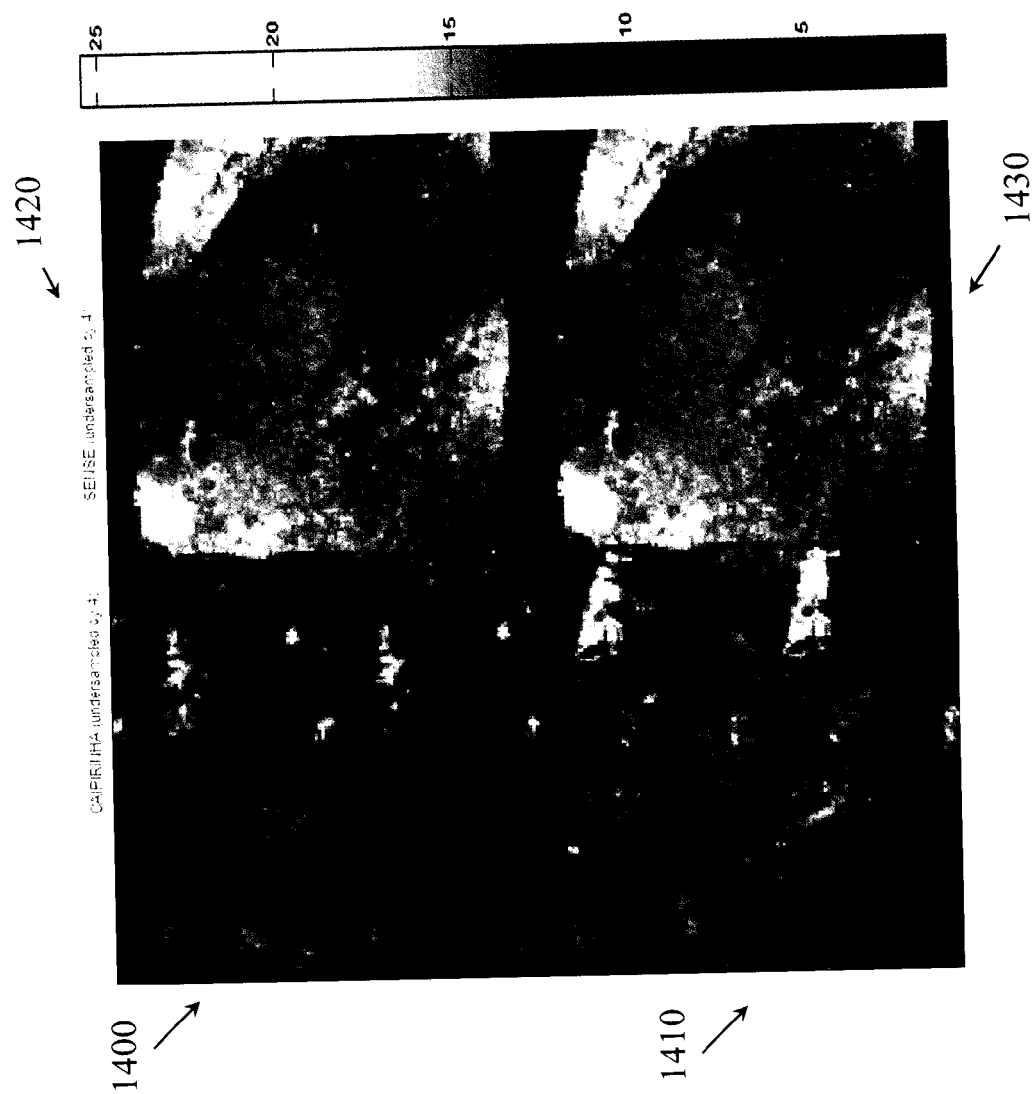
FIG. 14 illustrates g-factor maps for the reconstructed TrueFISP-CAIPIRINHA images of FIG. 13 and for the reconstructed TrueFISP-SENSE images of FIG. 13.

FIG. 14 illustrates g-factor maps 1400 and 1410 for the reconstructed TrueFISP-CAIPIRINHA images 1310 and 1320 of FIG. 13. FIG. 14 also illustrates g-factor maps 1420 and 1430 for the reconstructed TrueFISP-SENSE images 1340 and 1350 of FIG. 13. Once again, comparing and contrasting the g-factor maps illustrates improved performance (e.g., higher SNR) for the TrueFISP-CAIPIRINHA approach as compared to conventional SENSE reconstructions.

Having reviewed experimental results that illustrate how multi-slice blipped TrueFISP-CAIPIRINHA improves over conventional systems, FIGS. 15-21 now explain how example apparatus and methods can be configured to produce the multi-slice blipped TrueFISP-CAIPIRINHA pulse sequence.

Figure 15:
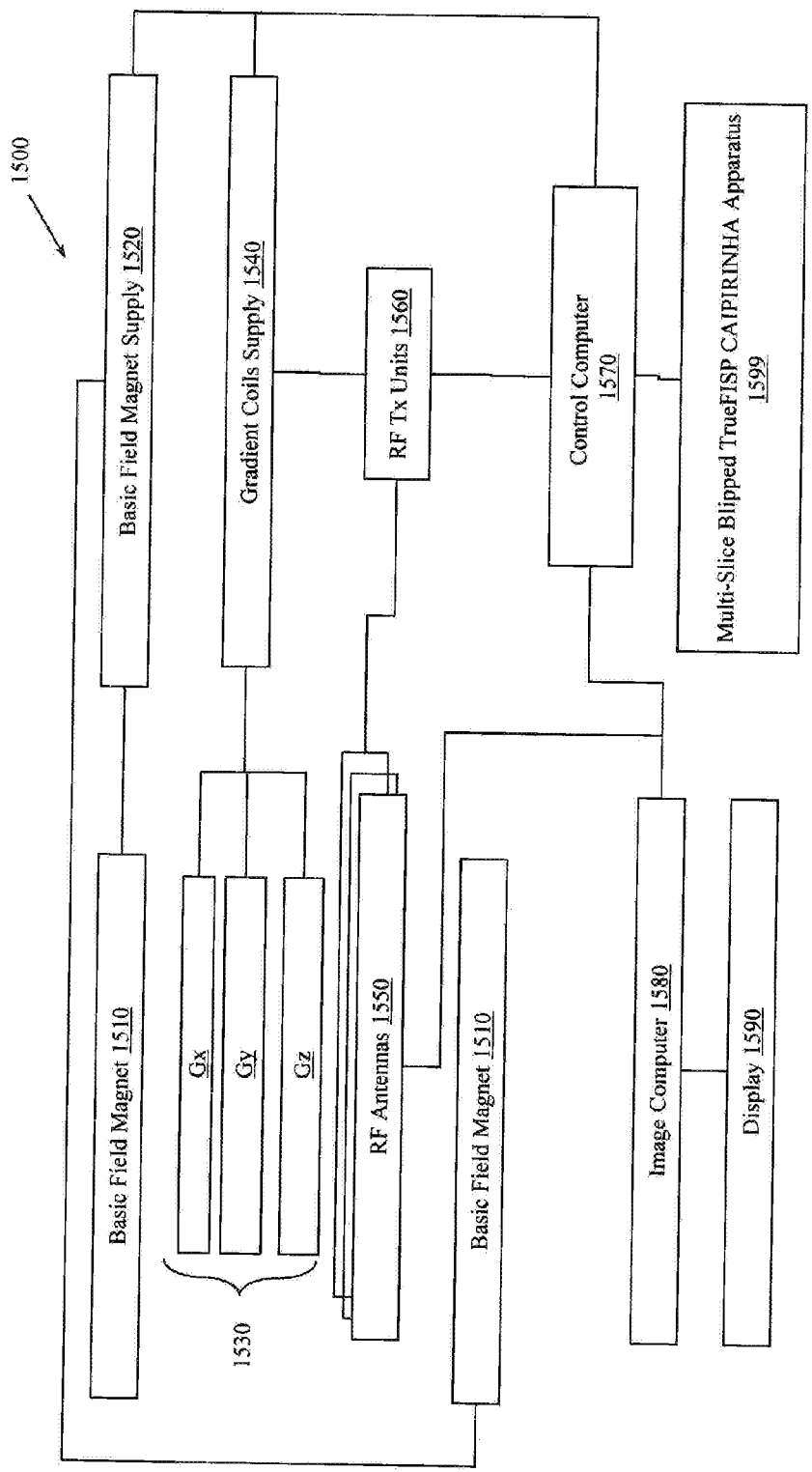
FIG. 15 illustrates an MRI apparatus configured to perform a multi-slice blipped TrueFISP-CAIPIRINHA trajectory.

FIG. 15 illustrates an example MRI apparatus 1500 configured with an apparatus 1599 configured to perform multi-slice blipped TrueFISP-CAIPIRINHA. The apparatus 1599 may be configured with elements of example apparatus described herein and/or may perform example methods described herein. In one embodiment, apparatus 1599 may provide means for producing CAIPIRINHA phase cycling in a TrueFISP-CAIPRINHA pulse sequence using a blipped gradient pattern to produce cyclic phase shifting instead of using RF pulses to produce cyclic phase shifting. The means may include, for example, circuits, programmed logics, and a special purpose computer.

The apparatus 1500 includes a basic field magnet(s) 1510 and a basic field magnet supply 1520. Ideally, the basic field magnets 1510 would produce a uniform $B_0$ field. However, in practice, the $B_0$ field may not be uniform, and may vary over an object being imaged by the MRI apparatus 1500. MRI apparatus 1500 may include gradient coils 1530 configured to emit gradient magnetic fields like $G_S$, $G_P$, and $G_R$ or Gx, Gy, and Gz. The gradient coils 1530 may be controlled, at least in part, by a gradient coils supply 1540. In some examples, the timing, strength, and orientation of the gradient magnetic fields may be controlled, and thus selectively adapted, during an MRI procedure. Selectively controlling one gradient (e.g., Gs) facilitates producing the cyclic phase shifting.

MRI apparatus 1500 may include a set of RF antennas 1550 that are configured to generate RF pulses and to receive resulting NMR signals from an object to which the RF pulses are directed. In one embodiment, the RF antennas 1550 are arranged as an array of parallel transmission coils that are individually controllable. How the pulses are generated and how the resulting MR signals are received may be controlled and thus may be selectively adapted during an MR procedure. Separate RF transmission and reception coils can be employed. The RF antennas 1550 may be controlled, at least in part, by a set of RF transmission units 1560. An RF transmission unit 1560 may provide a signal to an RF antenna 1550. The RF transmission unit 1560 may provide different signals to different RF antennas to produce different RF excitations from the different members of the array of parallel transmission coils.

The gradient coils supply 1540 and the RE transmission units 1560 may be controlled, at least in part, by a control computer 1570. In one example, the control computer 1570 may be programmed to control an NMR device as described herein. Conventionally, the magnetic resonance signals received from the RF antennas 1550 can be employed to generate an image and thus may be subject to a transformation process like a two dimensional Fast Fourier Transform (FFT) that generates pixilated image data. The transformation can be performed by an image computer 1580 or other similar processing device. The image data may then be shown on a display 1590.

While FIG. 15 illustrates an example MRI apparatus 1500 that includes various components connected in various ways, it is to be appreciated that other MRI apparatus may include other components connected in other ways.

Figure 16:
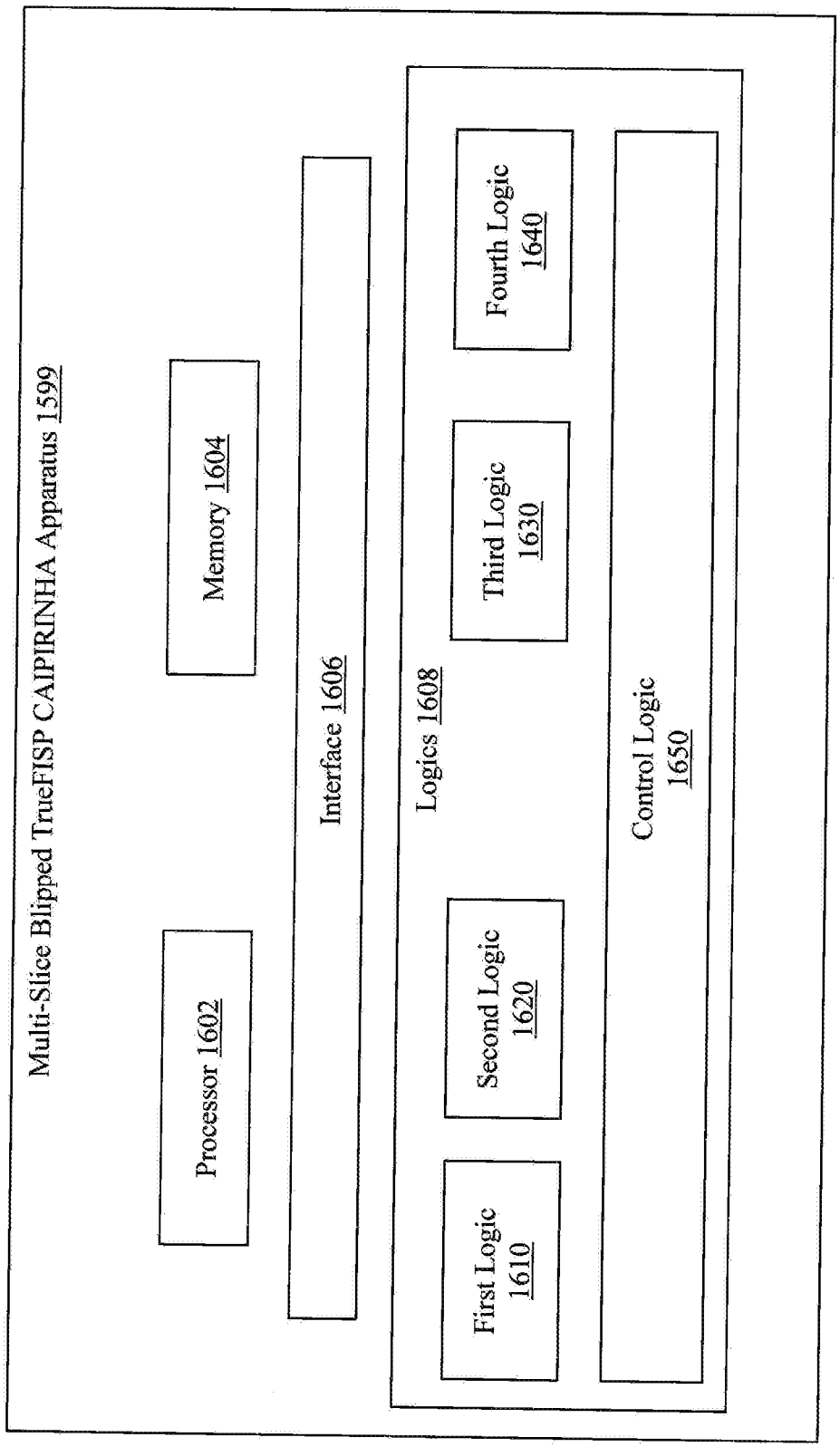
FIG. 16 illustrates an apparatus configured to perform a multi-slice blipped TrueFISP-CAIPIRINHA trajectory.

FIG. 16 illustrates an embodiment of a TrueFISP-CAIPIRINHA apparatus 1599. Apparatus 1599 may be a computer, electronic, or other apparatus that is configured to control an MRI apparatus (e.g., apparatus 1500) to produce a multi-slice blipped TrueFISP-CAIPIRINHA pulse sequence. Apparatus 1599 may include a first logic 1610 that is configured to add a finite gradient area to a de-phase pulse produced by a slice select gradient during the TrueFISP-CAIPIRINHA pulse sequence. Adding the finite gradient area to the de-phase pulse is part of producing the CAIPIRINHA cyclic phase shifting through blipped gradients instead of through RE pulses.

Apparatus 1599 may also include a second logic 1620 that is configured to add the finite gradient area to a re-phase pulse produced by the slice select gradient during the TrueFISP-CAIPIRINHA pulse sequence. Adding the finite gradient area to the re-phase pulse is also part of producing the CAIPIRINHA cyclic phase shifting through blipped gradients instead of through RF pulses.

Apparatus 1599 may also include a third logic 1630 that is configured to remove the finite gradient area from a de-phase pulse produced by the slice select gradient during the TrueFISP-CAIPIRINHA pulse sequence. Removing the finite gradient area from the de-phase pulse is part of producing the CAIPIRINHA cyclic phase shifting through blipped gradients instead of through RF pulses. Removing the finite gradient area is also part of balancing the gradient.

Apparatus 1599 may also include a fourth logic 1640 that is configured to remove the finite gradient area from a re-phase pulse produced by the slice select gradient during the TrueFISP-CAIPIRINHA pulse sequence. Removing the finite gradient area from the re-phase pulse is also part of producing the CAIPIRINHA cyclic phase shifting through blipped gradients instead of through RF pulses. Removing the finite gradient area is also part of balancing the gradient.

Apparatus 1599 may also include a control logic 1650 that is configured to control the first logic 1610, the second logic 1620, the third logic 1630, and the fourth logic 1640 to introduce CAIPIRINHA phase shift cycling for members of the multiple slices processed by the multi-slice blipped TrueFISP-CAIPIRINHA pulse sequence. The phase shift cycling is implemented by selectively adding and removing the finite gradient area from de-phase pulses and re-phase pulses rather than by using RF pulses as in conventional CAIPIRINHA.

Different acquisitions may desire different blipped gradients and thus the control, logic 1650 may, in one embodiment, be configured to manipulate the finite gradient, area by controlling, the amplitude of the slice select gradient. In another embodiment, the control logic 1650 is configured to manipulate the finite gradient area by controlling the amount of time the slice select gradient is on.

Recall that balanced gradients are used in balanced steady state free precession. Therefore, in one embodiment, the control logic 1650 is configured to co-ordinate the first logic 1610 and the second logic 1620 to add the finite gradient area in the same TR and to co-ordinate the third logic 1630 and the fourth logic 1640 to remove the finite gradient area in the next TR. In one embodiment, the control logic 1650 is configured to co-ordinate the first logic 1610 and the second logic 1620 to add the finite gradient area in a first TR while simultaneously coordinating the third logic 1630 and the fourth logic 1640 to remove the finite gradient area in a second, subsequent TR. The control logic 1650 may introduce the cyclic phasing by alternating additions and deletions between TRs. Therefore, in one embodiment, control logic 1650 is configured to alternate between controlling the first logic 1610 and the second logic 1620 to add the finite gradient area, and controlling the third logic 1630 and the fourth logic 1640 to remove the finite gradient area, where the alternating occurs per TR.

The finite gradient area may be (re)configured depending on different conditions experienced or expected in an acquisition. Thus, in one example, the control logic 1650 may be configured to selectively configure the finite gradient area based on a gyromagnetic ratio associated with a resonant species in a sample to which the multi-slice blipped TrueFISP-CAIPIRINHA pulse sequence will be applied. In another example, the control logic 1650 may be configured to selectively configure the finite gradient area based on factors including, but not limited to, differences between slices to be processed by the multi-slice blipped TrueFISP-CAIPIRINHA pulse sequence, and a phase by which slices to be processed by the multi-slice blipped TrueFISP-CAIPIRINHA pulse sequence are to be shifted.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic. The physical manipulations create a concrete, tangible, useful, real-world result.

It has proven convenient at times, principally for reasons of common usage, to refer to these signals as bits, values, elements, symbols, characters, terms, or numbers. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, fewer than all the illustrated blocks may be required to implement an example methodology. Blocks may be combined or separated into multiple components. Furthermore, additional and/or alternative methodologies can employ additional, not illustrated blocks.

Figure 17:
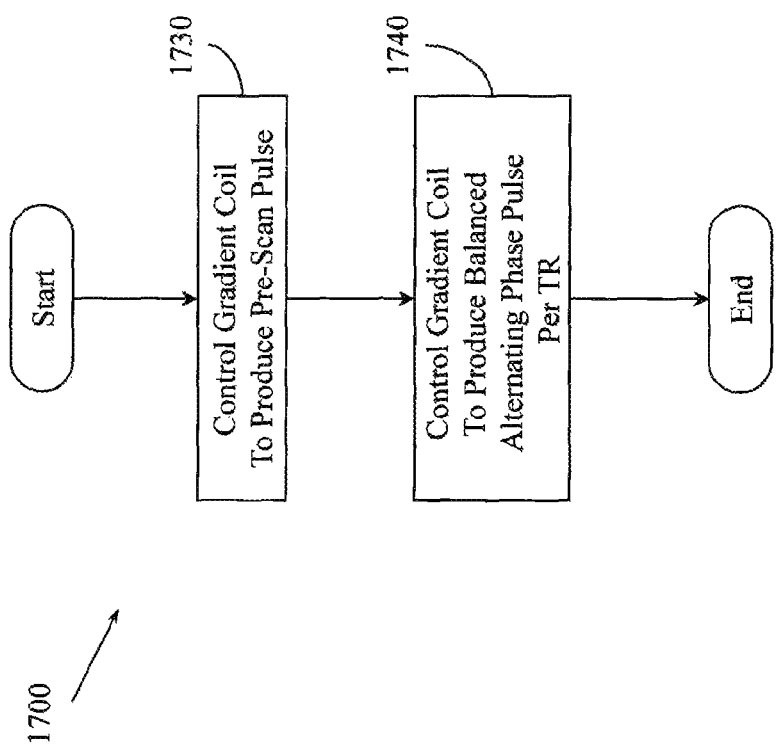
FIG. 17 illustrates an example method associated with producing a multi-slice blipped TrueFISP-CAIPIRINHA.

FIG. 17 illustrates a method 1700 associated with producing a multi-slice blipped TrueFISP-CAIPIRINHA pulse sequence. The TrueFISP-CAIPIRINHA pulse sequence is configured to excite two slices in parallel and to acquire nuclear magnetic resonance (NMR) signals from the two slices in parallel. While two slices are described, a greater number of slices may be excited in parallel and acquired in parallel. Producing the multi-slice blipped TrueFISP-CAIPIRINHA pulse sequence may include multiple actions that control a gradient coil. In one example, the slice select gradient coil is the gradient coil that is controlled.

Method 1700 includes, at 1730, controlling the gradient coil to produce a pre-scan pulse configured to set magnetization into a steady state position. In one example, the pre-scan pulse may be an $\alpha/2$ pulse. Different pre-scan pulses may be employed in different embodiments.

Method 1700 also includes, at 1740, controlling the gradient coil to produce a balanced alternating phase pulse per TR to introduce a CAIPIRINHA aliasing pattern between slices. In one example, the balanced alternating phase pulse is a $\pi$ pulse. Different balanced alternating phase pulses may be employed in different embodiments.

Figure 18:
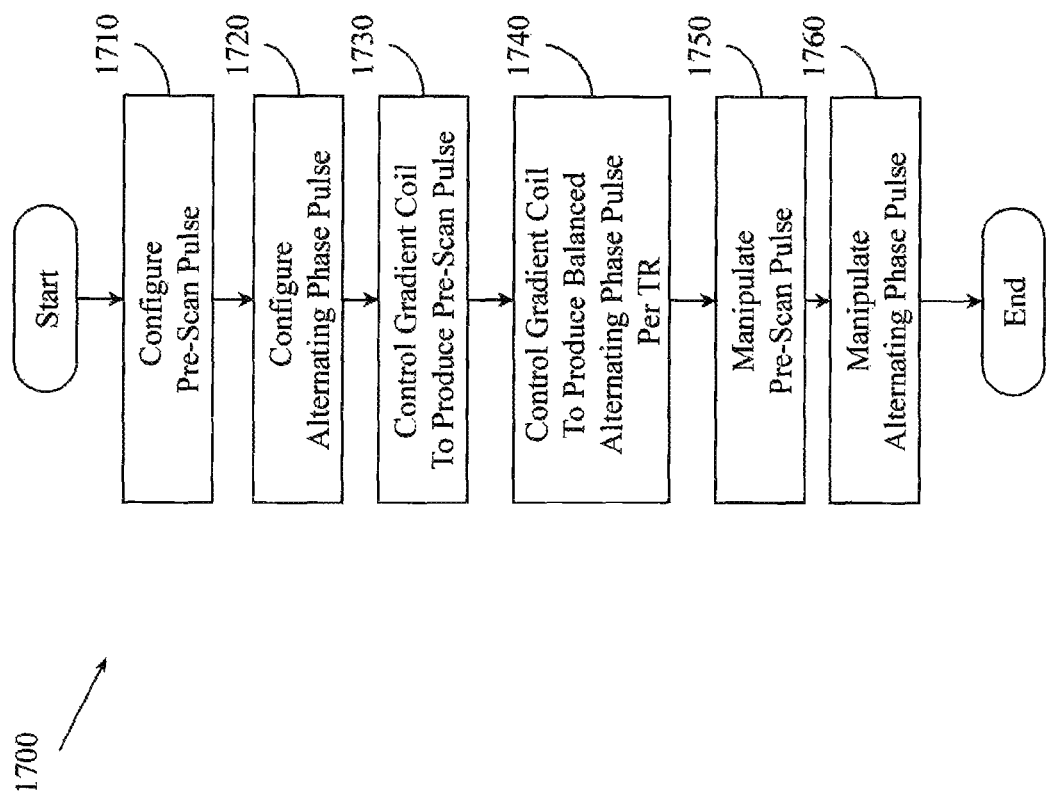
FIG. 18 illustrates an example method associated with producing a multi-slice blipped TrueFISP-CAIPIRINHA.

FIG. 18 illustrates another embodiment of method 1700 (FIG. 17). This embodiment of method 1700 includes actions additional actions 1710, 1720, 1750, and 1760 for configuring and reconfiguring either the pre-scan pulse or the alternating phase pulse.

This embodiment of method 1700 includes, at 1710, selectively configuring the pre-scan pulse. In one embodiment, the pre-scan pulse may be (re)configured based on a gyromagnetic ratio associated with a resonant species in a sample to which the multi-slice blipped TrueFISP-CAIPIRINHA pulse sequence will be applied. The pre-scan pulse may also be (re)configured based on differences between the two slices, or on a phase by which the two slices are to be shifted by the CAIPIRINHA phase cycling.

This embodiment of method 1700 also includes, at 1720, selectively configuring the balanced alternating phase pulse. In one embodiment, the balanced alternating phase pulse may be (re)configured based on a gyromagnetic ratio associated with a resonant species in a sample to which the multi-slice blipped TrueFISP-CAIPIRINHA pulse sequence will be applied. The balanced alternating phase pulse may also be (re)configured based on differences between the two slices, or on a phase by which the two slices are to be shifted by the CAIPIRINHA phase cycling.

This embodiment of method 1700 also includes, at 1750, selectively manipulating the pre-scan pulse by controlling the amplitude of the gradient produced by the gradient coil. The pre-scan pulse may also be manipulated by controlling the amount of time the gradient coil is on.

This embodiment of method 1700 also includes, at 1760, manipulating the alternating phase pulse by controlling the amplitude of the gradient produced by the gradient coil. The alternating phase pulse may also be manipulated by controlling the amount of time the gradient coil is on.

Figure 19:
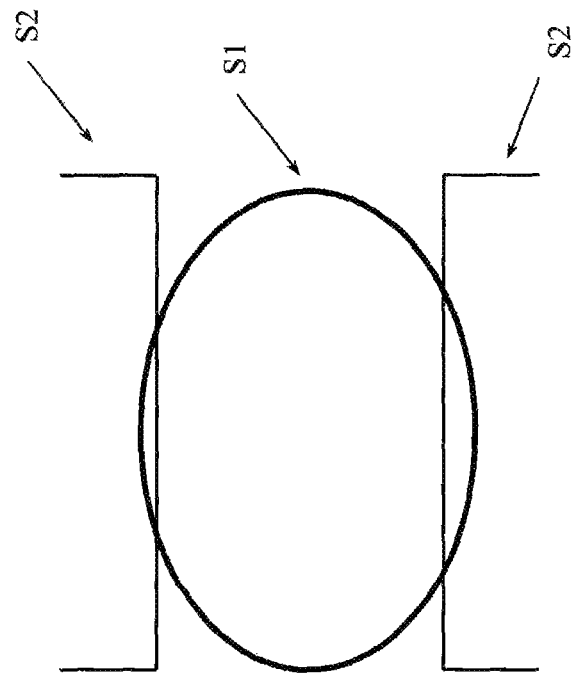
FIG. 19 illustrates slice shifting in multi-slice CAIPIRINHA.

FIG. 19 illustrates a result of an example multi-slice TrueFISP-CAIPIRINHA sequence where a first slice S1 appears centered while a second slice S2 appears shifted to the edge. Shifting the two slices that are acquired in parallel facilitates mitigating aliasing artifacts because the artifacts do not end up aligned or super-imposed on each other. Recall that CAIPIRINHA involves phase cycling where, for example, slice S1 may maintain a first state (e.g., +) while slice S2 may alternate between states (e.g., +/−).

Figure 20:
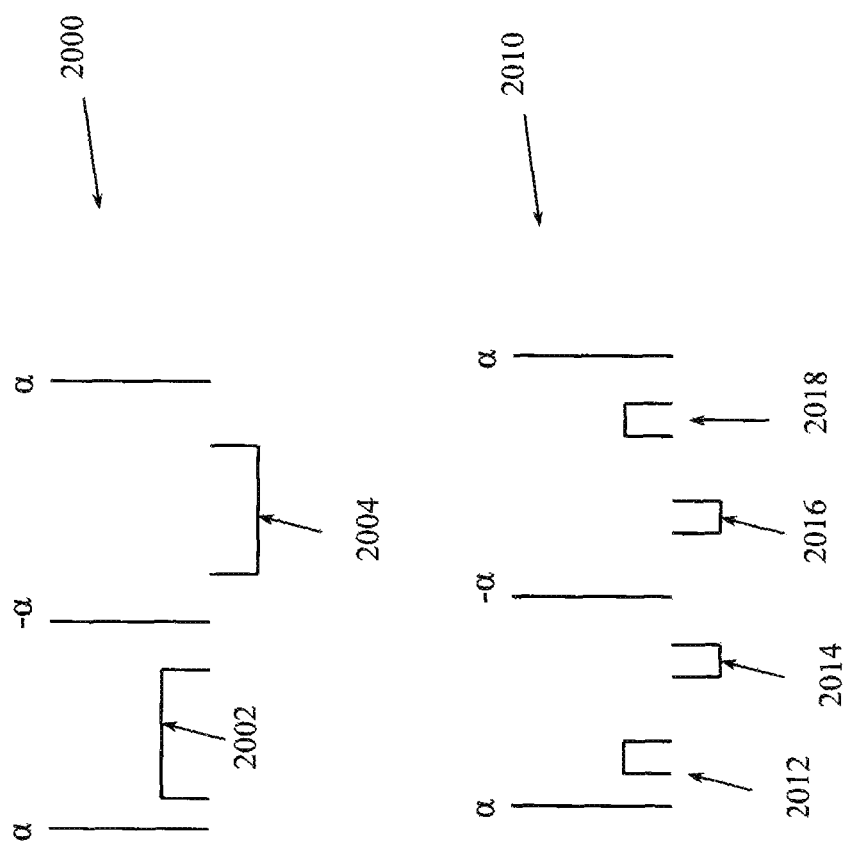
FIG. 20 illustrates a TrueFISP sequence and a TrueFISP-CAIPIRINHA sequence where balanced gradients are being used to generate +/− shifts.

FIG. 20 illustrates a TrueFISP sequence 2000 and a TrueFISP-CAIPIRINHA sequence 2010. Compare the balanced gradients 2002 and 2004 in the TrueFISP sequence 2000 to the balanced gradients 2012, 2014, 2016, and 2018 in the TrueFISP-CAIPIRINHA sequence 2010. TrueFISP sequence 2000 does not produce the phase cycling while the TrueFISP-CAIPIRINHA sequence does induce the phase cycling.

Figure 21:
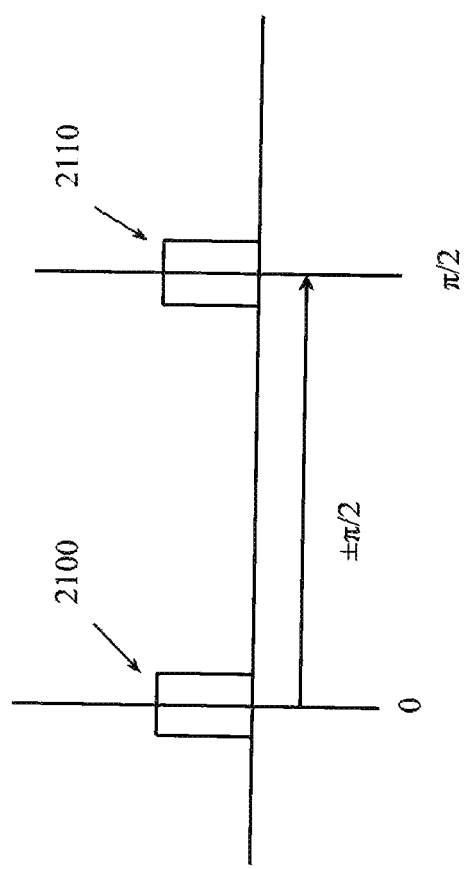
FIG. 21 illustrates slices that were separated by a TrueFISP-CAIPIRINHA sequence.

FIG. 21 illustrates slices that were separated by a TrueFISP-CAIPIRINHA sequence. A first slice 2100 may not be phase shifted while a second slice 2110 may be phase shifted. Shifting the phase facilitates moving slices so that they do not align, which in turn facilitates mitigating issues associated with aligned under-sampling aliasing artifacts.

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, andother embodiments described herein. Therefore, the invention is not limited to the specific details, the representative apparatus, and illustrative examples shown and described. Thus, this application is intended to embrace alterations, modifications, and variations that fall within the scope of the appended claims.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other memories. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, or combinations of each to perform a function(s) or an action(s), and/or to cause a function or action from another logic, method, or system. Logic may include a software controlled microprocessor, a discrete logic (e.g., ASIC), an analog circuit, a digital circuit, a programmed logic device, a memory device containing instructions, and other devices. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, or logical communications may be sent or received. An operable connection may include a physical interface, an electrical interface, or a data interface. An operable connection may include differing combinations of interfaces or connections sufficient to allow operable control. For example, two entities can be operably connected to communicate signals to each other directly or through one or more intermediate entities (e.g., processor, operating system, logic, software). Logical or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method of controlling a magnetic resonance imaging (MRI) apparatus comprising:
   controlling a magnetic resonance imaging (MRI) apparatus in order to produce and apply a multi-slice blipped True Fast Imaging with Steady-state Precession Controlled Aliasing in Parallel Imaging Results in Higher Acceleration (TrueFISP-CAIPIRINHA) pulse sequence that is configured to excite at least two slices in parallel and also acquire nuclear magnetic resonance (NMR) signals from the two slices that were excited in parallel, where producing the multi-slice blipped TrueFISP-CAIPIRINHA pulse sequence includes:
   controlling a gradient coil in the MRI apparatus in order to produce a blipped gradient pattern through CAIPIRINHA phase cycling by:
      controlling the gradient coil in order to produce a pre-scan pulse that sets generated magnetization into a steady state position by controlling the amplitude of the gradient produced by the gradient coil or by controlling the amount of time the gradient coil is on followed by;
      controlling the gradient coil in order to produce a balanced alternating phase pulse per repetition time (TR) that thereby introduces a CAIPIRINHA aliasing pattern between the two slices, that were excited in parallel, by controlling the amplitude of the gradient produced by the gradient coil or by controlling the amount of time the gradient coil is on;
   acquiring, in parallel from the two slices, NMR signals produced in response to the multi-sliced blipped TrueFISP-CAIPIRINHA pulse sequence, and
   producing, on a display component an image reconstructed from the acquired NMR signals produced in response to the applied multi-slice blipped pulse sequence.

2. The method of claim 1, where the pre-scan pulse applied by the gradient coil is an $\alpha/2$ pulse.

3. The method of claim 2, comprising selectively configuring the pre-scan pulse based on a gyromagnetic ratio associated with a resonant species in a sample to which the multi-slice blipped TrueFISP-CAIPIRINHA pulse sequence is applied.

4. The method of claim 1, comprising selectively configuring the balanced alternating phase pulse based on a gyromagnetic ratio associated with a resonant species in a sample to which the multi-slice blipped TrueFISP-CAIPIRINHA pulse sequence is applied.

5. The method of claim 1, comprising selectively configuring the pre-scan pulse, or the balanced alternating phase pulse, with respect to existing differences between the two slices that were excited in parallel.

6. The method of claim 1, comprising selectively configuring the pre-scan pulse, or the balanced alternating phase pulse, based on a phase by which the at least two parallel excited slices are to be shifted as a result of the application of the blipped gradient pattern produced through CAIPIRINHA phase cycling.

7. The method of claim 1, comprising manipulating the pre-scan pulse and the balanced alternating phase pulse by controlling both the amplitude of the gradient produced by the gradient coil and the amount of time that the gradient coil is on.

8. The method of claim 1, where the gradient coil in the MRI apparatus is the slice select gradient coil.

9. A processing apparatus configured to control an MRI apparatus, in order to produce and apply a multi-slice blipped TrueFISP-CAIPIRINHA pulse sequence, that is configured to excite at least two slices in parallel and also acquire nuclear magnetic resonance (NMR) signals from the two slices that were excited in parallel, the apparatus comprising:
   a first logic circuit that is configured to produce a blipped gradient pattern by adding a finite gradient area onto a first de-phase pulse that is produced by a slice select gradient during a first repetition time (TR) within the multi-sliced blipped TrueFISP-CAIPIRINHA pulse sequence;

a second logic circuit that is configured to produce a blipped gradient pattern by adding the finite gradient area onto a first re-phase pulse that is produced by the slice select gradient during the first TR in within the multi-sliced blipped TrueFISP-CAIPIRINHA pulse sequence;

a third logic circuit that is configured to produce a blipped gradient pattern by removing the added finite gradient area from a second de-phase pulse produced by the slice select gradient during a second TR within the multi-sliced blipped TrueFISP-CAIPIRINHA pulse sequence, a fourth logic circuit that is configured to produce a blipped gradient pattern by removing the added finite gradient area from a second re-phase pulse produced by the slice select gradient during the second TR within the multi-sliced blipped TrueFISP-CAIPIRINHA pulse sequence, a control logic circuit that is configured to control the first logic circuit, the second logic circuit, the third logic circuit, and the fourth logic circuit in order to introduce the blipped gradient pattern onto members of the parallel excited multiple slices processed by the applied multi-slice blipped TrueFISP-CAIPIRINHA pulse sequence in different repetition times (TRs), where the control logic circuit is configured in order to manipulate the finite gradient area by controlling the amplitude of the slice select gradient, or by controlling the amount of time that the slice select gradient is on, where the control logic circuit also acquires, in parallel from the multiple slices, NMR signals that are produced in response to the applied multi-slice blipped TrueFISP-CAIPIRINHA pulse sequence, and where the control logic circuit produces an image from the acquired NMR signals produced in response to the applied multi-slice blipped TrueFISP-CAIPIRINHA pulse sequence; and provides that produced image on a display.

10. The NMR apparatus of claim 9, where the control logic circuit is configured to co-ordinate the first logic circuit and the second logic circuit in order to add the finite gradient area in a same TR of the multi-slice blipped TrueFISP-CAIPIRINHA pulse sequence.

11. The NMR apparatus of claim 9, where the control logic circuit is configured to co-ordinate the third logic circuit and the fourth logic circuit in order to remove the finite gradient area in a same TR of the multi-slice blipped TrueFISP-CAIPIRINHA pulse sequence.

12. The NMR apparatus of claim 9, where the control logic circuit is configured:
  to co-ordinate the first logic circuit and the second logic circuit in order to add the finite gradient area into the first TR of the multi-slice blipped TrueFISP-CAIPIRINHA pulse sequence, and
  to co-ordinate the third logic circuit and the fourth logic circuit in order to remove the finite gradient area from the second TR, with the second TR being a subsequent TR of the multi-slice blipped TrueFISP-CAIPIRINHA pulse sequence.

13. The NMR apparatus of claim 9, where the control logic circuit is configured to alternate between controlling the first logic circuit and the second logic circuit in order to add the finite gradient area, and controlling the third logic circuit and the fourth logic circuit in order to remove the finite gradient area, where the alternating occurs per TR of the multi-slice blipped TrueFISP-CAIPIRINHA pulse sequence.

14. The NMR apparatus of claim 9, with the control logic circuit being configured in order to selectively configure the finite gradient area based on a gyromagnetic ratio that is associated with a resonant species in a sample to which the multi-slice blipped TrueFISP-CAIPIRINHA pulse sequence is applied.

15. The NMR apparatus of claim 13, with the control logic circuit being configured in order to selectively configure the finite gradient area based on one or more of, differences existing between the multiple excited parallel slices that are processed by the multi-slice blipped TrueFISP-CAIPIRINHA pulse sequence, and a phase by which the multiple excited parallel slices that are processed by the multi-slice blipped TrueFISP-CAIPIRINHA pulse sequence are shifted.

* * * * *

UNITED STATES PATENT AND TRADEMARK OFFICE
CERTIFICATE OF CORRECTION

PATENT NO.         : 9,086,468 B2
APPLICATION NO.    : 13/445001
DATED              : July 21, 2015
INVENTOR(S)        : Duerk et al.

It is certified that error appears in the above-identified patent and that said Letters Patent is hereby corrected as shown below:

Title page, item 57

In the Abstract:

In line 5, delete "CAIPRINHA" and insert --CAIPIRINHA--.

In the specification

In the Detailed Description:

In column 4, line 37, delete "Figure" and insert --FIG.--.

In column 6, line 48, delete "TrueFISP-CAIPRINHA" and insert --TrueFISP-CAIPIRINHA--.

In column 8, line 9, delete "control, logic" and insert --control logic--.

In column 8, line 10, delete "gradient, area" and insert --gradient area--.

In column 8, lines 10-11, delete "controlling, the" and insert --controlling the--.

In column 8, line 66, delete "is appreciated" and insert --is to be appreciated--.

In column 10, line 36, delete "andother" and insert --and other--.

Signed and Sealed this
Fifteenth Day of December, 2015

Michelle K. Lee
*Director of the United States Patent and Trademark Office*